(12) United States Patent
Lu et al.

(10) Patent No.: US 6,518,679 B2
(45) Date of Patent: Feb. 11, 2003

(54) CAPACITIVE ALIGNMENT STRUCTURE AND METHOD FOR CHIP STACKING

(75) Inventors: Ning Lu, Essex Junction, VT (US); Wilbur David Pricer, Charlotte, VT (US); Charles Arthur Whiting, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 165 days.

(21) Appl. No.: 09/738,167

(22) Filed: Dec. 15, 2000

(65) Prior Publication Data

US 2002/0191835 A1 Dec. 19, 2002

(51) Int. Cl.[7] ............................................. H01L 23/544
(52) U.S. Cl. ......................... 257/797; 257/528; 257/532
(58) Field of Search .............................. 257/777, 797, 257/786, 528, 532, 531

(56) References Cited

U.S. PATENT DOCUMENTS

| | | | |
|---|---|---|---|
| 4,566,193 A | 1/1986 | Hackleman et al. | 33/1 |
| 4,658,331 A | 4/1987 | Berg | 361/387 |
| 4,721,365 A | 1/1988 | Nishimura | 350/336 |
| 4,941,255 A | 7/1990 | Bull | 29/833 |
| 5,130,660 A | 7/1992 | Flint et al. | 324/662 |
| 5,459,081 A | 10/1995 | Kajita | 437/3 |
| 5,610,528 A | 3/1997 | Neely et al. | 324/660 |
| 5,638,469 A | 6/1997 | Feldman et al. | 385/14 |
| 5,700,297 A | 12/1997 | Vollaro | 29/25.01 |
| 5,712,190 A | 1/1998 | Bertin et al. | 437/173 |
| 5,872,025 A | 2/1999 | Cronin et al. | 438/109 |

*Primary Examiner*—Roy Potter
(74) *Attorney, Agent, or Firm*—Downs Rachlin Martin PLLC

(57) ABSTRACT

An alignment structure (14) and method for aligning a first circuit image region (18) of a microelectronic chip (10) with a second circuit region (20) of a wafer (12). The alignment structure comprises a plurality of passive coupling elements (22) attached to the chip and arranged in a linear array and further comprises a plurality of electrodes (24) attached to the wafer and arranged in a linear array. The electrodes are arranged into a set of first driven electrodes (46), a set of second driven electrodes (48) and a set of sensing electrodes (50). The first driven, second driven and sensing electrodes are arranged alternatingly with one another and may each include one or more plates (62). The first and second driven electrodes are driven, respectively, with sine wave signals 180 degrees out of phase with one another. When each passive coupling element is centered over a corresponding sensing electrode, the signals from all of the sensing electrodes are null, indicating that the first circuit image region is aligned with the second circuit image region in the alignment direction. In an alternative embodiment, individual electrodes are configurable into different size first driven, second driven and sensing electrodes to adjust the alignment resolution of the alignment structure.

20 Claims, 7 Drawing Sheets

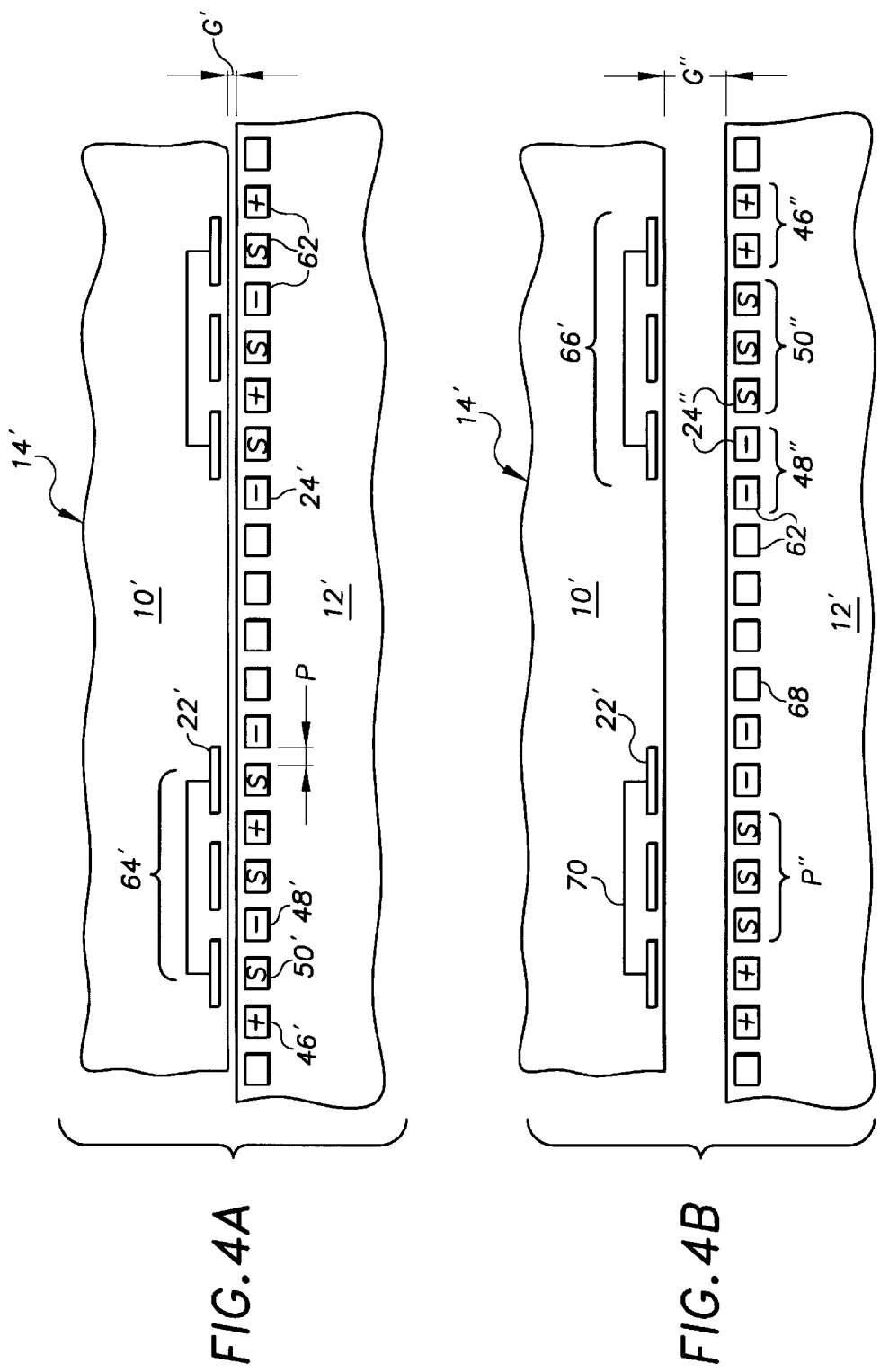

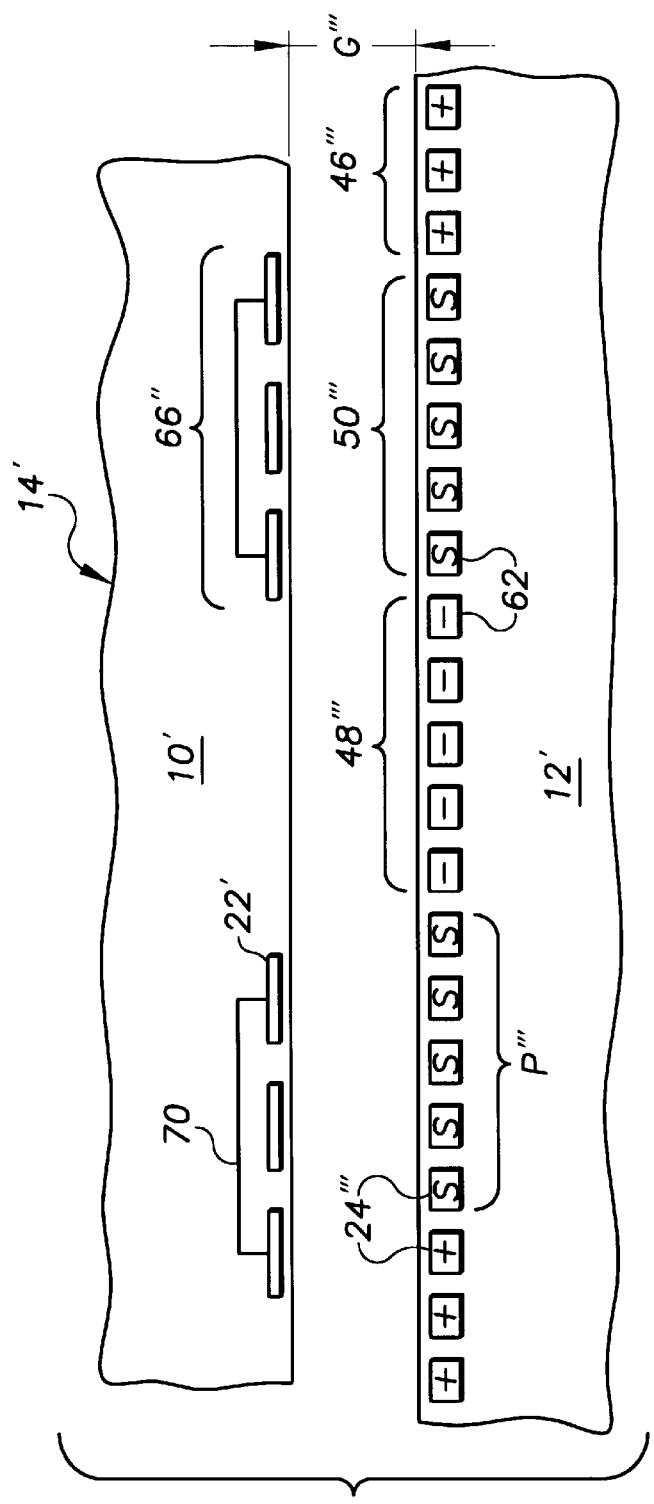

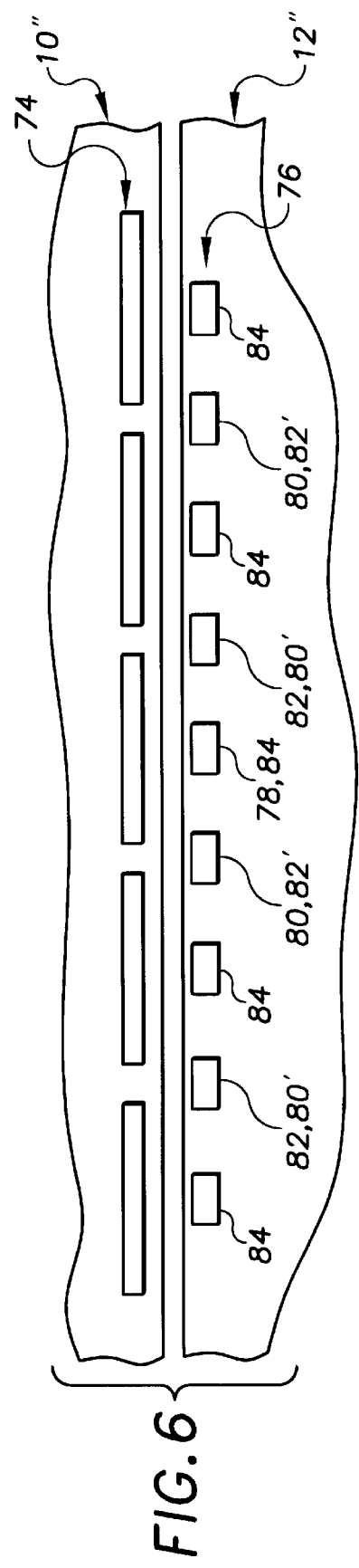

and a wafer incorporating one pair of alignment structures, one for the x-direction and one for the y-direction, of the present invention.

CAPACITIVE ALIGNMENT STRUCTURE AND METHOD FOR CHIP STACKING

FIELD OF INVENTION

The present invention relates generally to the field of microelectronics manufacturing and, more particularly, to a structure and method for precisely aligning a first circuit image region of a microelectronic chip with a second circuit image region of a wafer.

BACKGROUND OF THE INVENTION

A continuing need exists for joining microelectronic chips to one another. For example, in the field of application specific integrated circuits (ASICs) it is often desirable to join memory chips, such as DRAM, NVRAM and FeRAM, to logic chips. The greatest opportunity for allowing the maximum number of interface connections between two chips is to join the chips face-to-face. In this manner, the circuit image regions of the two chip are directly exposed to each other over the largest possible surface area. In addition, joining chips face-to-face minimizes the distance and material required to make the interconnections as well as minimizes electrical interference between the conductors used to make the interconnections.

Joining chips face-to-face, however, requires precise alignment between the corresponding circuit image regions. Presently, the tolerance for alignment is on the order of about 100–150 nm, and this tolerance will only decrease as circuit features become smaller as time progresses. Optical registration tools, such as an "M" tool developed for integrated circuit fabrication, are suitable for face-to-face alignment of microelectronic chips but are only capable of crude alignment. The "M" tool comprises a prism that allows a tool operator to simultaneously view registration marks on the adjacent faces of two chips as the faces are brought proximate one another. The prism, however, must be located between the two chips for the operator to observe the opposing registration marks. When the chips are spaced from one another by a distance slightly larger than the height of prism, the prism must be removed before the chips can be moved closer together. The height of the prism is enormous by modem lithographic standards. After the tool operator removes the prism, optical observation of the opposing surfaces is no longer possible and the tool operator must close the gap without any information concerning the alignment or non-alignment of the registration marks. Even under the best conditions, misregistration would greatly exceed the fine tolerances allowable by the present invention.

U.S. Pat. No. 5,130,660 to Flint et al. shows a miniature electronic device aligner for precisely aligning an optical device, such as a laser, with a package substrate. The package substrate includes a detector plate and two energized capacitor plates actively energized by sinusoidal signals 180 degrees out of phase with one another. The optical device includes a passive capacitor plate that, when the optical plate is properly aligned with the package, extends over the two capacitor plates and the detector plate on the package. The actively energized capacitor plates passively drive the passive capacitor plate. When the optical device is properly aligned, the out-of-phase charges induced by the energized capacitor plates cancel each other in the passively driven plate and the signal sensed by the detector plate is at a minimum.

The Flint et al. aligner is not capable of the fine resolution necessary to align two bodies to a tolerance of on the order of 150 nm or less, which is required for joining two microelectronic chips to one another. In addition, the Flint et al. aligner cannot provide different levels of resolution for aligning two bodies with one another when the bodies are spaced from each other by different distances. Moreover, the Flint et al. aligner cannot sense the tilt of one body with respect to another body. The present invention overcomes these and other limitations of conventional micro-alignment structures and methods.

SUMMARY OF THE INVENTION

In one aspect, the present invention is directed to a structure for aligning a first body and a second body relative to one another. The structure includes a plurality of passive coupling elements attached to the first body and spaced from one another. The structure further includes a plurality of first driven electrodes attached to the second body and spaced from one another. A plurality of second driven electrodes are attached to the second body and are spaced from and located alternatingly with the plurality of first driven electrodes. A plurality of sensing electrodes are attached to the second body and are spaced from and located alternatingly with the plurality of first driven electrodes and the plurality of second driven electrodes.

In another aspect, the present invention is directed to a method of aligning a first body and a second body with one another, wherein one of the first and second bodies has a plurality of electrodes arranged in a first set, a second set and a third set. Each set comprises at least two electrodes. The electrode in the first, second and third sets are located alternatingly with one another. The method includes driving the at least two electrodes in the first set with a first varying electrical signal and driving the at least two electrodes in the second set with a second varying electrical signal that is out of phase with said first varying electrical signal. Then, at least one of said first and second bodies is moved such that at least one of said passive coupling element is proximate at least two of the plurality of electrodes. A third electrical signal from at least one of the electrodes in the third set is sensed.

BRIEF DESCRIPTION OF THE DRAWINGS

For the purpose of illustrating the invention, the drawings show forms of the invention that are presently preferred. However, it should be understood that the present invention is not limited to the precise arrangements and instrumentalities shown in the drawings.

FIGS. 4A–4C illustrate a configurable alignment structure of the present invention configured for, respectively, fine, medium and coarse alignment resolution.

FIG. 6 is a cross-sectional view of the bidirectional alignment structure as taken along lines 6—6 of FIG. 5.

DETAILED DESCRIPTION OF THE INVENTION

Figure 1:
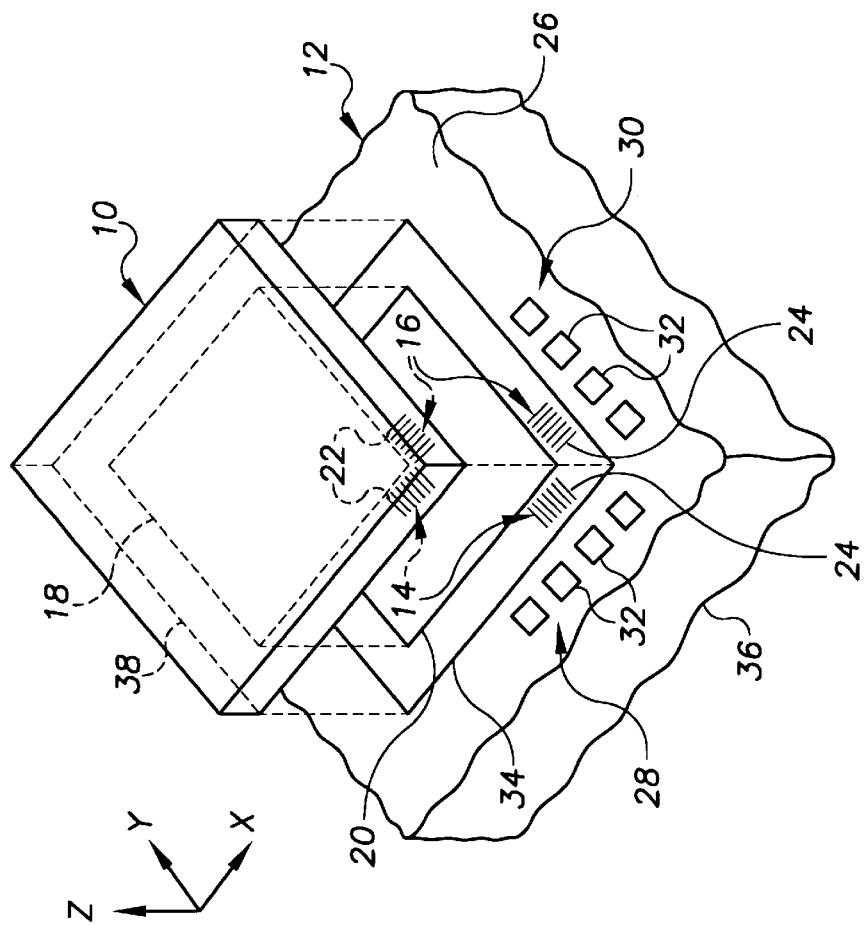
FIG. 1 is an isometric view of a microelectronic chip and a wafer incorporating one pair of alignment structures, one for the x-direction and one for the y-direction, of the present invention.

Referring now to the drawings, wherein like numerals indicate like elements, FIG. 1 illustrates a microelectronic chip 10 and a wafer 12 incorporating two alignment structures 14 and 16, respectively, of the present invention. Alignment structures 14, 16 permit the precise alignment, or registration, of a first circuit image region 18 of microelectronic chip 10 with a second circuit image region 20 of wafer 12 in the x-direction any-direction, respectively, to permit face-to-face joining of the chip to the wafer. Face-to-face joining allows precisely located electrical interconnections (not shown) to be made between first circuit image region 18 and second image region 20.

Each alignment structure 14, 16 utilizes capacitance between a set of passive coupling elements 22 located on chip 10 and a set of electrodes 24 located on wafer 12 for aligning the chip with the wafer. Face 26 of wafer 12 includes two sets 28, 30 of electrical contacts 32 for sending electrical signals to and receiving electrical signals from electrodes 24 of corresponding alignment structure 14, 16, as described in detail below. Electrical contacts 32 are located outside of contact region 34, which chip 10 will occupy when it is joined to wafer 12, so that they are accessible throughout the alignment and joining process.

Although FIG. 1 shows alignment structures 14, 16 used in conjunction with microelectronic chip 10 and wafer 12, alignment structures 14, 16 of the present invention may also be used, either singly or together, for aligning other structures, such as a first wafer to a second wafer, a first microelectronic chip to a second microelectronic chip, an optoelectronic chip to a wafer, a first optoelectronic chip to a second optoelectronic chip, among others. One skilled in the art will recognize the many and various pairs of bodies, including bodies outside of the microelectronics field, with which the alignment structure of the present invention may be used to bring the bodies into precise registration with one another. In addition, although electrical contacts 32 are shown located adjacent their corresponding alignment structure 14, 16, they may be located elsewhere, such as on face 36 opposite second circuit image region 20. By locating electrical contacts 32 on face 36, alignment structures 14, 16 may be used for chip-to-chip registration where the contact regions of the chips to be joined have approximately equal areas. Moreover, although face 26 and face 38 of chip 10 are typically planar, alignment structures 14, 16 of the present invention may be adapted for use with a curved faces, such as faces forming cylindrical segments or spherical segments.

Figure 2:
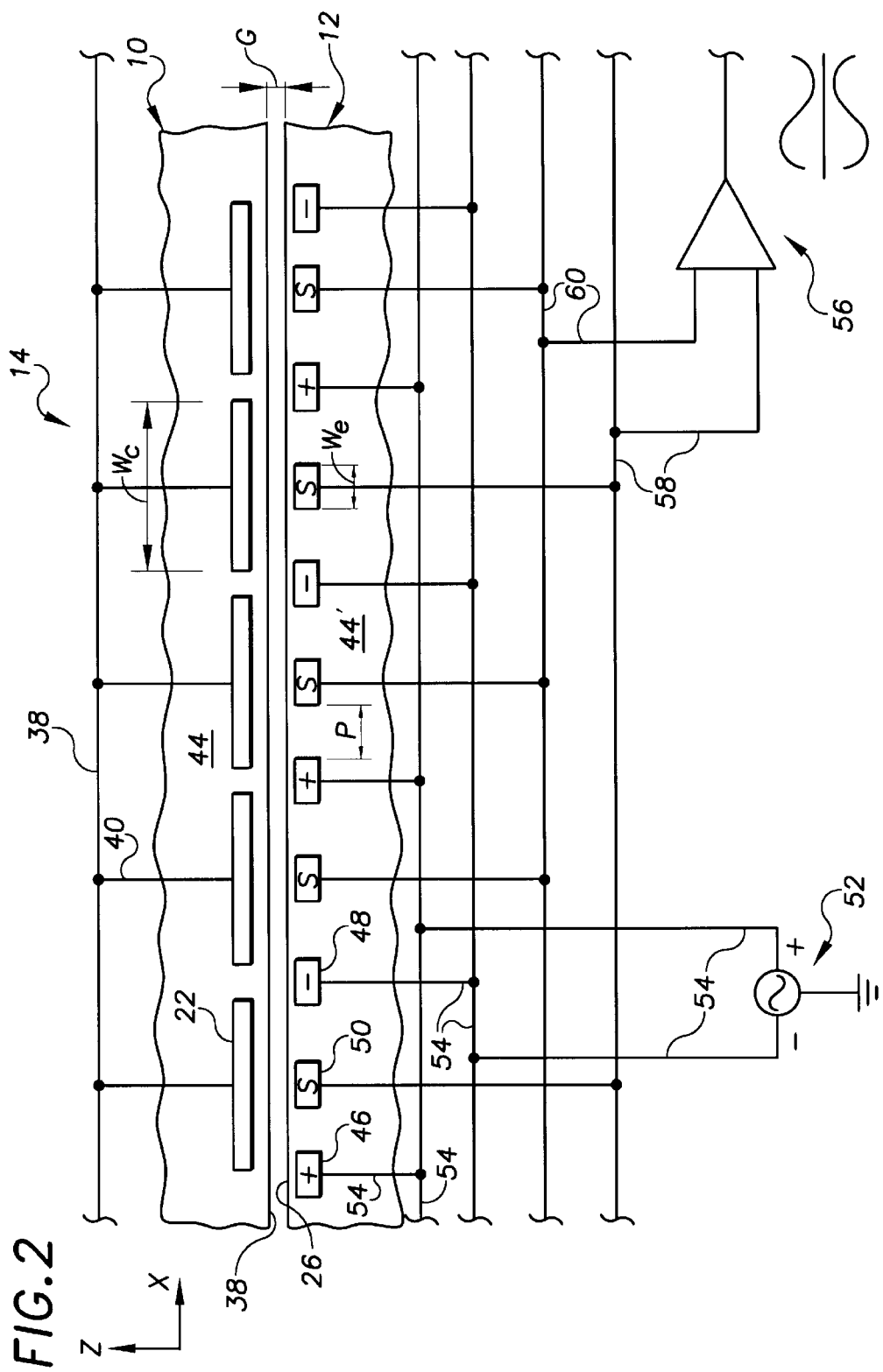
FIG. 2 is an enlarged cross-sectional view of one embodiment of the x-direction alignment structure shown in FIG. 1.

As shown in FIG. 2, passive coupling elements 22 are preferably permanently electrically coupled to one another as shown by common conductor 38 and connecters 40, which connect the passive coupling elements to the common conductor. Conductor 38 and connecters 40 are shown only schematically since there are many options for interconnecting passive coupling elements 22. For example and as one skilled in the art will understand, common conductor 38 and connecters 40 may be located in one or more layers (not shown) of chip 10 that form various microelectronic circuits including wires and devices, e.g., transistors, logic gates and the like, aboard the chip. In alternative embodiments, however, passive coupling elements 22 need not be all connected together to a single common conductor 38. In one embodiment and when passive coupling elements 22 are connected to one another, the passive coupling elements may form "fingers" of a comb-like structure, wherein common conductor 38 is the "backbone" of the comb-like structure. In another embodiment interdigitated passive coupling elements are connected to multiple conductors 38 to form multiple comb-like structures.

Passive coupling elements 22 are preferably plates and are made of a conductive material, such as aluminum or copper. In FIG. 2, passive coupling elements 22 are arranged in a linear array along a line parallel to the x-axis of FIG. 1. Alignment structure 16 is identical to alignment structure 14 illustrated in FIG. 2, but is arranged in a linear array along a line parallel to the y-axis of FIG. 1. Passive coupling elements 22 are preferably embedded in chip 10 such that each is surrounded by an insulating material 44. The insulating material 44 may be any insulating material, such as solid state silicon dioxide or a low dielectric constant material, e.g., silicon dioxide containing entrained tiny voids, that is compatible with the other layers of chip 10.

Electrodes 24 are arranged into three sets, a set of first driven electrodes 46 (also indicated by a "+" sign), a set of second driven electrodes 48 (also indicated by a "−" sign) and a set of sensing electrodes 50 (also indicated by an "S"). First and second driven electrodes 46, 48 may be located in alternating fashion with respect to one another singularly or in clusters in a linear array along a line parallel to the x-axis shown in FIG. 1 and are made of a conductive material such as aluminum or copper. First and second driven electrodes 46, 48 are actively driven by first and second varying electrical signals, which are out of phase with one another. For example, first and second driven electrodes 46, 48 are electrically connected to opposite poles of a signal generator 52 by conductors 54.

Signal generator 52 is preferably a sine wave generator that provides the first and second driven electrodes 46, 48, respectively, with signals that are 180 degrees out of phase with one another. Thus, the sign convention used in the present specification is "+" and "−", where the opposite signs represent the opposite polarities of the out-of-phase signals. Although signal generator 52 is preferably a sine wave generator, other signal generators, such as triangular wave, among others, may be used. First and second driven electrodes 46, 48 are preferably driven at a high frequency, such as 10 MHz. A preferable range of frequencies is 1 MHz to 100 MHz. However other frequencies may be used, as long as the frequency is higher than the frequency induced into sensing electrodes 50 by the movement of chip 10 relative to wafer 12. First and second driven electrodes 46, 48 passively drive passive coupling elements 22.

In the illustration of FIG. 2, each sensing electrode 50 is preferably located between and adjacent to a corresponding pair of first and second driven electrodes 46, 48, as shown. However, the linear array of electrodes 24 may alternatively have a sensing electrode 50 located at one, the other or each of its ends. Sensing electrodes 50 are made of a conductive material, such as copper or aluminum, and are preferably embedded in an insulating material 44'. Sensing electrodes 50 are connected to a sense amplifier/comparator 56 through a first common conductor 58 and a second common conductor 60. Every other sensing electrode 50 is connected to first common conductor 58 and the remaining sensing electrodes are connected to second common conductor 60. The electrical signal carried by first common conductor 58 and second common conductor 60 are sensed 180 degrees out of phase with one another to minimize cross-capacitance among conductors 54, 58, 60 that connect together the various components of alignment structure 14.

The resolution of alignment structure 14 is generally determined by the widths of passive coupling elements 22, the widths of electrodes 24 and the spacing between adjacent electrodes. Preferably, the widths $W_e$ of all electrodes 24 are identical with one another. However, widths $W_e$ may be different among the different types of electrodes and/or from electrode to electrode. The width $W_c$ of passive coupling elements 22 is preferably in a range of about two to about four times width of electrodes 24. Of course, other widths may be used to suit a particular design. To obtain the finest alignment resolution, the widths $W_e$ electrodes 24 should be as small as present masking techniques allow. The spacing, or pitch, P between adjacent electrodes 24 is preferably about equal to width $W_e$ of the electrodes.

To obtain a useful alignment signal, i.e., a signal that is discernable from background or other noise and is usable for capacitive alignment in accordance with the present invention, from sense amplifier/comparator 56, electrodes 24 must have a minimum capacitive surface area and the gap G between passive coupling elements 22 and the electrodes must generally be equal to or less than spacing S of the electrodes. For example, in one embodiment it was determined that the capacitive surface area of electrodes 24 should be on the order of 0.5 mm$^2$ to obtain a useful alignment signal. To achieve a required capacitive surface area, the length (perpendicular to the plane of FIG. 2) and/or number of electrodes 24, and correspondingly the length and/or number of passive coupling elements 22, may be adjusted accordingly. One skilled in the art will recognize the technical tradeoffs at various levels of resolution between adjusting the length of electrodes 24 and passive coupling elements 22 and adjusting the number of electrodes and passive coupling elements.

Figure 3A:
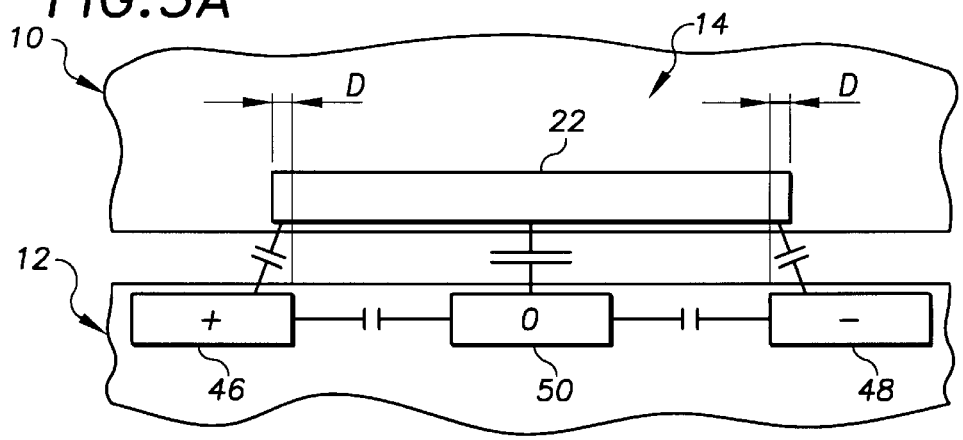
FIGS. 3A–3C are enlarged cross-sectional views of one group of electrodes and a passive coupling member of the alignment structure of FIG. 1, showing the relative capacitance between various pairs of components of the alignment structure.
Figure 3B:
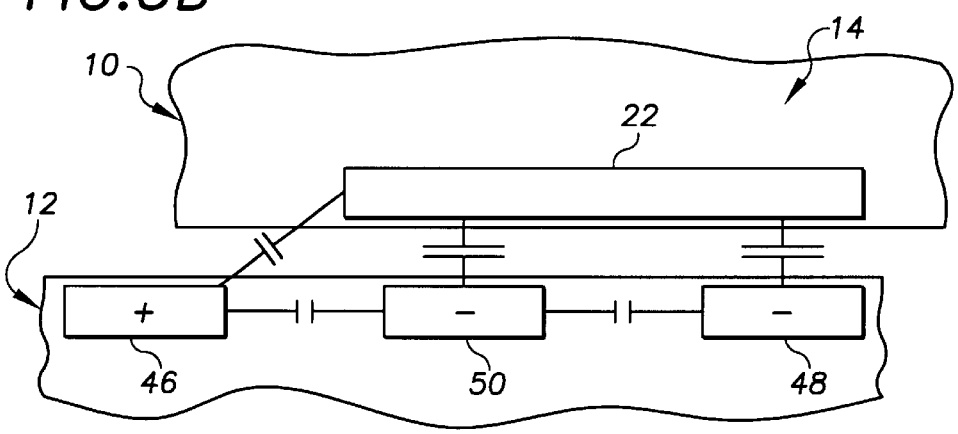
Figure 3C:
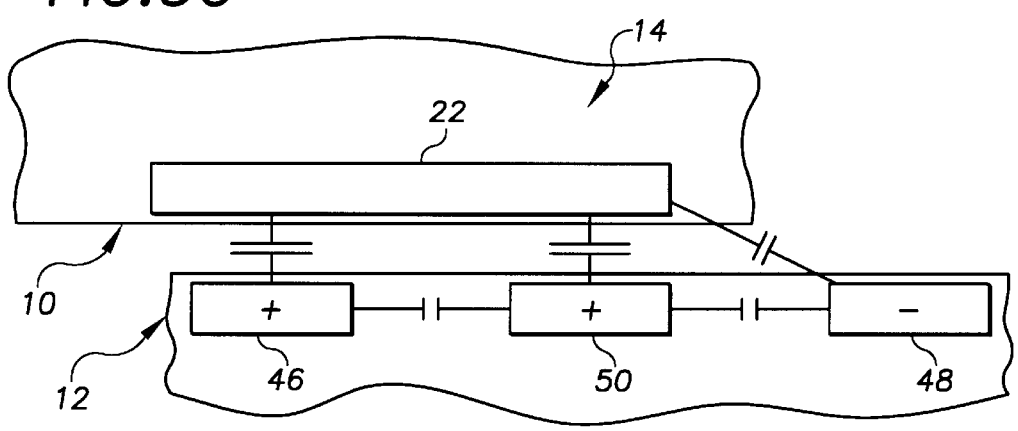

FIGS. 3A–3C illustrate the capacitance between adjacent components of alignment structure 14 when wired as shown in FIG. 2 when one passive coupling element 22 is located in three different positions relative to a group of electrodes consisting of one first driven electrode 46, one second driven electrode 48 and one sensing electrode 50. Generally, the size of the capacitor symbols in FIGS. 3A–3C indicate the relative capacitance between the corresponding elements.

In FIG. 3A, passive coupling element 22 is centered over sensing electrode 50. When centered thus, passive coupling plate 22 is driven equally by first driven electrode 46 and second driven electrode 48. Therefore, the (+) and (−) charges of the 180 degree out-of-phase signals from first and second driven electrodes cancel each other so that the signal sensed at sensing electrode 50 is a null signal (0) that indicates passive coupling element 22 is centered over the sensing electrode. Preferably, this null signal (0) indicates that chip 10 (see FIG. 2) and wafer 12 are in proper registration with one another. Alternatively, proper registration may be selected to occur at another sensed signal, such as a maximum positive signal or a maximum negative signal.

Passive coupling element 22 is shown overlapping each of first and second driven electrodes 46, 48 by a distance D measured between the corresponding proximate ends of the coupling elements and first and second driven electrodes when the passive coupling element is centered over sensing electrode 50. It is noted that passive coupling element 22 need not overlap first and second driven electrodes as shown. However, distance D at each end of passive coupling element 22 must be the same if the null position is to be detected when the passive coupling element is centered over sensing electrode 50. A null signal at sensing electrode 50 will also occur when there is no passive coupling element 22 proximate to sensing electrode 50. A procedure for determining whether a null signal is due to a centered passive coupling element 22 or the absence of a passive coupling element is described below in conjunction with FIG. 4A.

FIG. 3B shows passive coupling element 22 located off center of sensing electrode 50 and over second driven electrode 48. When passive coupling element 22 is in this position, the (−) charge from second driven electrode 48 dominates over the (+) charge from first driven electrode 46 due to the passive coupling element's closer proximity and larger area exposed to the second driven electrode. Thus, the net charge in passive coupling element 22 and the signal sensed at sensing electrode 50 is negative. FIG. 2C shows passive coupling element 22 located off center of sensing electrode 50 and over first driven electrode 46. When passive coupling element 22 is in this position, the (+) charge from first driven electrode 46 dominates over the (−) charge from second driven electrode 48 due to the passive coupling element's closer proximity and larger area exposed to the first driven electrode. Thus, the net charge in passive coupling element 22 and the signal sensed at sensing electrode 50 is positive. In accordance with the foregoing, the method of aligning chip 10 with wafer 12 includes moving the chip relative to the wafer, or vice versa, until a null signal is sensed at sensing electrodes 50 and it is determined that the null signal is due to proper alignment rather than a misalignment wherein one or more coupling elements 22 are not proximate a sensing electrode.

Referring now to FIGS. 4A–4C, there is shown an alternative alignment structure 14' according to the present invention wherein wafer 12' includes a plurality of plates 62 that may be selectively configured for providing the alignment structure with various configurations of electrodes 24' to allow for different levels of resolution, such as the fine, medium and coarse resolution configurations shown in FIGS. 4A–4C, respectively. Electrodes 24' may be selectively configured using an appropriate device, such as a crosspoint, or matrix, switch, in a manner that will be understood by one skilled in the art.

FIG. 4A shows alignment structure 14' configured for fine resolution for precisely aligning chip 10' with wafer 12' when gap G' is about equal to or less than spacing P' between adjacent electrodes 24'. Similar to alignment structure 14 of FIG. 2, electrodes 24' of alignment structure 14' are arranged into sets, a set of first driven electrodes 46' (also indicated by a "+" sign), a set of second driven electrodes 48' (also indicated by a "−" sign) and a set of sensing electrodes 50' (also indicated by an "S"). Passive coupling elements 22' are electrically connected to one another to form a symetrical passive coupling structure 64. For fine resolution, each passive coupling element 22' forms an effective capacitor plate 66 that is the size of a single passive coupling element. The term "effective capacitor plate" refers to a fictitious element comprising one or more passive coupling elements 22' that extends approximately from one first driven electrode 46' to an adjacent second driven electrode 48' when corresponding sensing electrode is sensing a null signal. The use of "effective capacitor plate" is only to aid visual understanding of FIGS. 4A–4C.

FIG. 4B shows alignment structure 14' configured for medium resolution for aligning chip 10' with wafer 12' when gap G'' is about equal to or less than spacing P'' across adjacent clusters of similarly driven or sensed electrodes 24''. In this embodiment, each of first driven electrodes 46'', second driven electrodes 48'' and sensing electrodes 50'' comprises two or three adjacent plates 62 and are spaced from one another such that several electrically passive plate 68 are located between some adjacent electrodes 24''. Correspondingly, when chip 10' and wafer 12' are properly aligned, i.e., sensing electrodes 50'' are providing a null signal, each effective capacitor plate 66' includes three passive coupling elements 22'. Electrical connecters 70 are fictitious and are used only to visually represent the connections among passive coupling elements 22' to form effective capacitor plates 66'.

FIG. 4C shows alignment structure 14' configured for coarse resolution for grossly aligning chip 10' with wafer 12' when gap G''' is about equal to or less than spacing P''' between adjacent clusters of similarly driven or sensed electrodes 24'. In this embodiment, each of first driven electrodes 46''', second driven electrodes 48''' and sensing electrodes 50''' comprises four or five adjacent plates 62 and are spaced from one another such that no electrically passive plates are located between adjacent electrodes 24'. Correspondingly, when chip 10' and wafer 12' are properly aligned, i.e., sensing electrodes 50''' are providing a null signal, each effective capacitor plate 66'' includes a cluster of passive coupling elements 22'. Again, electrical connecters 70 are fictitious and are used only to visually represent the connections among passive coupling elements 22' to form effective capacitor plates 66''.

Alternatively to configurable electrodes 24' described above, two or more linear arrays (not shown) of different size electrodes may be provided. For example, a first array may contain finely-spaced, small electrodes, a second array may contain coarsely-spaced, large electrodes and a third array may contain medium-spaced, medium-size electrodes. Each of the arrays may be energized separately until proper registration commensurate with the corresponding level of resolution is achieved.

In addition to providing a particular level of resolution, any two of the electrode configurations shown in FIGS. 4A–4C may be used to sense tilt of chip 10' relative to wafer 12'. For example, with respect to FIG. 4A, tilt sensing may be accomplished by first moving chip 10' out of proper alignment with wafer 12' so that the signals from corresponding sensing electrodes 50' are preferably at their largest magnitude. Then, a signal from a first sensing electrode 50', e.g., a sensing electrode adjacent one end of the linear array of electrodes 24' or at one corner of the chip image, is compared to a signal from a second sensing electrode, e.g., a sensing electrode located adjacent the opposite end of the linear array, or at another corner of the chip image, spaced from the first sensing electrode. If the magnitudes of these signals are different from one another, then chip 10' is tilted relative to wafer 12'. Conversely, if the magnitudes of these signals are the same, then chip 10' is not tilted relative to wafer 12'. For the most accurate tilt sensing, the first and second sensing electrodes should be as far apart as possible. Depending upon the size of the sensing electrodes 50', two or more sensing electrodes may need to be ganged together to obtain a useful signal.

Referring still to FIG. 4A, alignment structure 14', which is configured for fine resolution, may also be used for coarse alignment. To accomplish both fine and coarse alignment, the signals from at least some of sensing electrodes 50' must be individually sensed, as opposed to being sensed in groups as is depicted in FIG. 2. To achieve coarse alignment, chip 10' is moved relative to wafer 12' in a direction parallel to the plane of FIG. 4A. As chip 10' is moved relative to wafer 12', the signal from each sensing electrodes 50' will change from negative to null and then to positive, or vice versa depending upon the direction that the chip is moved, as a corresponding passive coupling element 22' passes over that sensing electrode. If the signal from one (or more) of the sensing electrodes 50' remains null, a passive coupling element 22' is not proximate to that sensing electrode. Coarse alignment would then continue by moving chip 10' relative to wafer 12' until all sensing electrode 50' provide a non-zero signal. When all sensing electrodes 50' are providing a non-zero signal, the finest adjustments may be made by moving chip 10' relative to wafer 12' in the last traveled direction until a null signal is obtained from all sensing electrodes.

Figure 5:
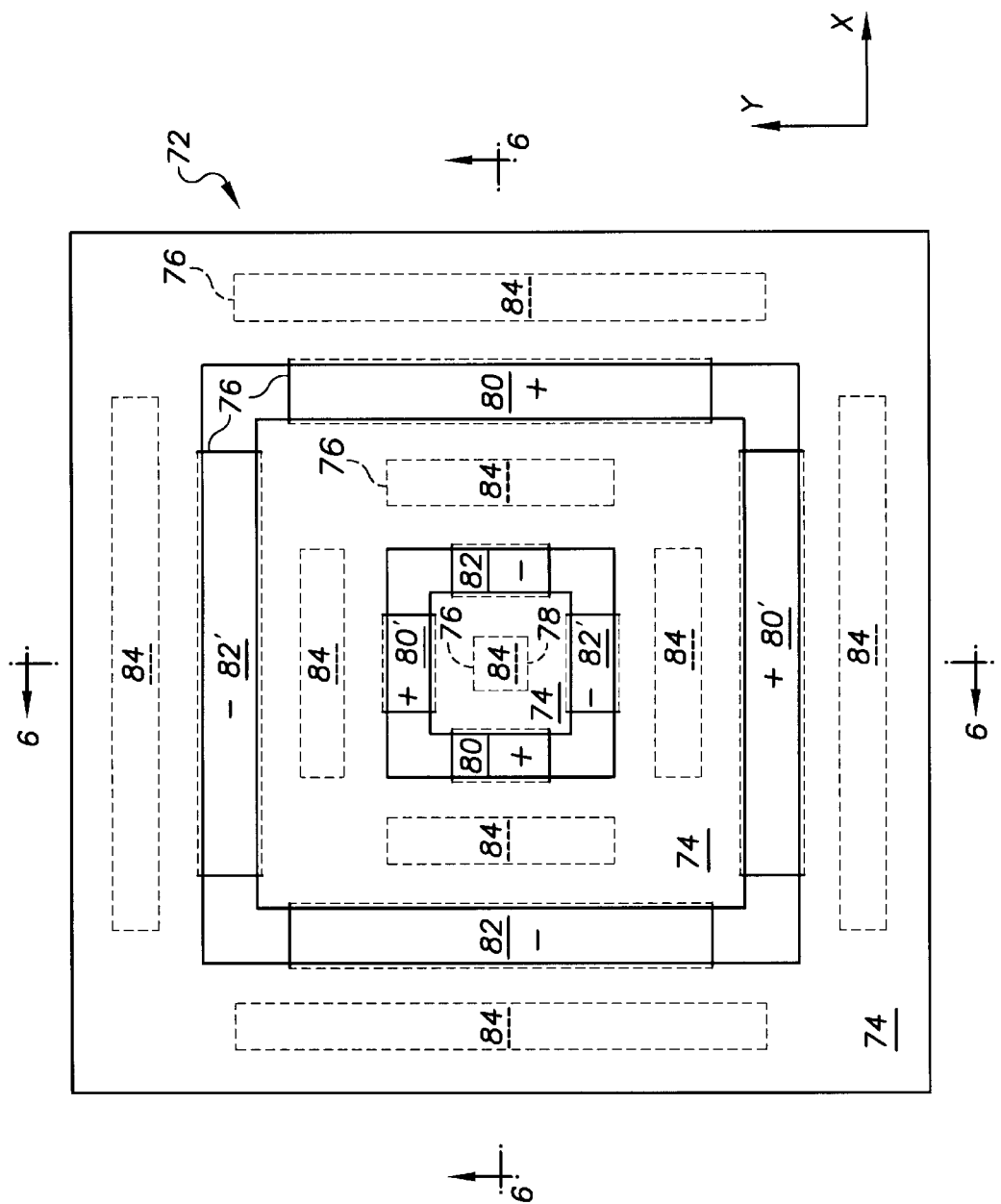
FIG. 5 is a plan view of a bidirectional alignment structure of the present invention.

FIGS. 5 and 6 show an alternative alignment structure 72 of the present invention that incorporates features for permitting alignment in both the x- and y-directions. Chip 10'' includes three or more passive coupling plates 74. The outer two passive coupling plates 74 form a box-like geometric shape. Passive coupling plates 74 are made of a conducting material, such as aluminum or copper, and are preferably embedded within an insulating material, such as solid state silicon dioxide or a low dielectric constant material. In FIG. 5 wafer 12'' includes seventeen electrode plates 76 grouped into nine x-direction electrodes and nine y-direction electrodes. Center electrode 78 is common to both the x- and y-direction electrodes. Each group of x- and y-direction electrodes includes three sets of electrodes, a set of first driven electrodes 80, 80', a set of second driven electrodes 82, 82' and a set of sensing electrodes 84, arranged in an alternating pattern similar to electrodes 46, 48, 50 of FIG. 2. Electrode plates 76 are preferably the same width as one another, but have lengths that vary with the distance from center electrode 78. Electrode plates 76 are preferably spaced from one another by a common distance. Any number of electrode plates 76 and passive coupling plates 74 may be provided to suit aparticular design and level of resolution. In addition, although electrode plates 76 are arranged along two mutually perpendicular lines parallel, respectively, to the x- and y- axes, they may be arranged along lines that intersect at an angle other than 90 degrees.

Alignment structure 72 functions in a manner similar to alignment structure 14 of FIG. 2. Aligning chip 10" with wafer 12" proceeds in only one direction at a time. That is, when aligning chip 10" and wafer 12" in the x-direction, only first and second driven electrodes 78, 80 are actively driven, but signals from all sensing electrodes 82 are sensed. Similarly, when aligning chip 10" with wafer 12" in the y-direction, only first and second driven electrodes 78', 80' are actively driven, but signals from all sensing electrodes 82 are sensed. An advantage of alignment structure 72 are the large capacitive surface areas of passive coupling plates 74 and sensing electrodes 82 relative to the overall area of alignment structure 72. This large capacitive surface area is due to using the regions of passive coupling plates 74 that are perpendicular to the direction in which chip 10" and wafer 12" are not being aligned all sensing electrodes 82, rather than using sensing electrodes 82 in only either the x- or y-direction.

Even though alignment structure 72 provides a relatively large capacitive surface area, a plurality of such alignment structures must be provided and suitably electrically connected together, to obtain a useful signal, as described above. Therefore, for most applications, an array (not shown) of alignment structures 72 must be provided. Such an array may be tightly-clustered, may comprise alignment structures 72 spaced relatively far from one another or may comprise any arrangement desired. In addition, electrode plates 76 may be configurable, either within an individual alignment structure 72 or among a number of alignment structures within an array, for various levels of resolution, coarse sensing using the finest configuration of electrode plates and sensing tilt, as described above in connection with FIGS. 4A–4C.

For example, an array may comprise a 40×40 square matrix of closely spaced alignment structures 72. At the finest level of resolution, electrode plates 76 within each alignment structure 72 may be configured as shown in FIG. 5. In addition, entire rows or columns, depending upon the active alignment direction, of electrode plates may be electrically connected to one another. However, for coarser resolution, entire alignment structures 72 in each row (or column) may be electrically connected to one another so that each row (or column) act as a single electrode, i.e., a first driven electrode, a second driven electrode or a sensing electrode. For even coarser resolution, entire alignment structures within multiple adjacent rows (or columns) may be electrically connected to one another so that groups of adjacent rows (or columns) act as single electrodes. One skilled in the art will recognize the many and various arrangements of electrode plates 76 and alignment structures 72 that may be made in accordance with the present invention.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. A structure for aligning a first body and a second body relative to one another, comprising:
    a. a plurality of passive coupling elements attached to the first body and spaced from one another;
    b. a plurality of first driven electrodes attached to the second body and spaced from one another;
    c. a plurality of second driven electrodes attached to the second body, said plurality of second driven electrodes spaced from and located alternatingly with said plurality of first driven electrodes; and
    d. a plurality of sensing electrodes attached to the second body, said plurality of sensing electrodes spaced from and located alternatingly with said plurality of first driven electrodes and said plurality of second driven electrodes.

2. The structure according to claim 1, wherein said plurality of first driven electrodes, said plurality of second driven electrodes and said plurality of sensing electrodes are arranged in a linear array.

3. The structure according to claim 1, wherein said plurality of first driven electrodes, said plurality of second driven electrodes and said plurality of sensing electrodes are arranged along two mutually transverse intersecting lines.

4. The structure according to claim 3, wherein at least one of said plurality of passive coupling elements forms a closed geometrical shape.

5. The structure according to claim 4, wherein said closed geometrical shape is a box.

6. The structure according to claim 1, further comprising a switching device and wherein said plurality of first driven electrodes, said plurality of second driven electrodes and said plurality of sensing electrodes are configurable via said switching device for different levels of alignment resolution.

7. The structure according to claim 6, wherein said plurality of first driven electrodes, said plurality of second driven electrodes and said plurality of sensing electrodes are connected to a crosspoint switch.

8. The structure according to claim 1, wherein each of said plurality of first driven electrodes, each of said plurality of second driven electrodes and each of said plurality of sensing electrodes comprises at least one plate.

9. The structure according to claim 8, wherein each of said plurality of first driven electrodes, each of said plurality of second driven electrodes and each of said plurality of sensing electrodes comprises a plurality of plates.

10. The structure according to claim 1, wherein at least two of said passive coupling plates are electrically connected to one another.

11. The structure according to claim 1, wherein at least two of said passive coupling plates form fingers of a comb.

12. The structure according to claim 1, wherein said plurality of first driven electrodes, said plurality of second driven electrodes and said plurality of sensing electrodes are arranged into a first group and a second group spaced from said first group, said electrodes in said first group being adapted for fine alignment when the first and second bodies are spaced from one another by a first distance and said electrodes in said second group being adapted for coarse alignment when the first and second bodies are spaced from one another by a second distance greater than said first distance.

13. A structure for aligning a first body and a second body relative to one another, comprising:
   a. a plurality of passive coupling elements attached to the first body and spaced from one another, at least two of said passive coupling elements electrically connected to one another;
   b. a plurality of configurable electrodes attached to the second body and spaced from one another; and
   c. a switching device in electrical communication with said plurality of configurable electrodes, said switching device for electrically configuring said plurality of configurable electrodes into at least one first driven electrode comprising at least two of said plurality of configurable electrodes, at least one second driven electrode comprising at least two of said plurality of configurable electrodes and at least one sensing electrode comprising at least two of said plurality of configurable electrodes.

14. The structure according to claim 13, wherein said switching device comprises a crosspoint switch.

15. The structure according to claim 13, wherein said plurality of configurable electrodes are alternatingly configurable via said switching device for fine resolution, wherein each of said at least one first driven electrode and said at least one second driven electrode comprises a first amount of said plurality of configurable electrodes, and coarse resolution, wherein each of said at least one first driven electrode and said at least one second driven electrode comprises a second amount of said plurality of configurable electrodes greater than said first amount.

16. A bidirectional alignment structure for aligning a first body and a second body with one another, comprising:
   a. a plurality of passive coupling elements attached to the first body and spaced from one another, at least one of said plurality of passive coupling elements forming a closed geometrical shape;
   b. a plurality of first driven electrodes attached to the second body and spaced from one another, said plurality of first driven electrodes arranged along two mutually transverse intersecting lines;
   c. a plurality of second driven electrodes attached to the second body, said plurality of second driven electrodes spaced from and located alternatingly with said plurality of first driven electrodes along each of said two mutually transverse intersecting lines; and
   d. a plurality of sensing electrodes attached to the second body, said plurality of sensing electrodes spaced from and located alternatingly with said plurality of first driven electrodes and said plurality of second driven electrodes along each of said two mutually transverse intersecting lines.

17. A bidirectional alignment structure according to claim 16, wherein said closed geometrical shape of said at least one passive coupling element is a box.

18. A structure for aligning a first body and a second body relative to one another, comprising:
   a. an array of bidirectional alignment structures as defined in claim 16.

19. An alignment structure according to claim 18, wherein is said array is rectangular.

20. An alignment structure according to claim 19, further comprising a switching device and wherein said bidirectional alignment structures are configurable for fine and coarse alignment via said switching device.

* * * * *